United States Patent
Aoki et al.

(10) Patent No.: US 7,727,867 B2
(45) Date of Patent: Jun. 1, 2010

(54) METHOD FOR MANUFACTURING SIMOX WAFER

(75) Inventors: Yoshiro Aoki, Tokyo (JP); Bong-Gyun Ko, Tokyo (JP)

(73) Assignee: Sumco Corporation, Tokyo (JP)

( * ) Notice: Subject to any disclaimer, the term of this patent is extended or adjusted under 35 U.S.C. 154(b) by 127 days.

(21) Appl. No.: 11/677,282

(22) Filed: Feb. 21, 2007

(65) Prior Publication Data

US 2007/0196995 A1 Aug. 23, 2007

(30) Foreign Application Priority Data

Feb. 21, 2006 (JP) ............................... 2006-043455

(51) Int. Cl.
*H01L 21/425* (2006.01)

(52) U.S. Cl. ................. 438/526; 438/174; 438/175; 438/527; 257/E21.135; 257/E21.315; 257/E21.563

(58) Field of Classification Search .................. 438/165, 438/174, 181, 194, 519, 914, 175, 282, 547; 257/E21.085, E21.1, E21.224, E21.315, E21.491
See application file for complete search history.

(56) References Cited

U.S. PATENT DOCUMENTS 5,930,643 A 7/1999 Sadana et al.

| | | | | |
|---|---|---|---|---|
| 2002/0098713 A1* | 7/2002 | Henley et al. | ............... | 438/776 |
| 2003/0087504 A1* | 5/2003 | Erokhin et al. | ............... | 438/407 |
| 2003/0211711 A1* | 11/2003 | Seki et al. | .................... | 438/480 |
| 2004/0013886 A1* | 1/2004 | Fox et al. | .................... | 428/446 |
| 2004/0241955 A1* | 12/2004 | Doris et al. | ................. | 438/423 |
| 2005/0170570 A1* | 8/2005 | DeSouza et al. | ............ | 438/162 |

FOREIGN PATENT DOCUMENTS

JP 07-263538 A 10/1995

OTHER PUBLICATIONS

English language Translation of JP 07-263538, Oct. 13, 1995.

* cited by examiner

*Primary Examiner*—Charles D Garber
*Assistant Examiner*—Cheung Lee
(74) *Attorney, Agent, or Firm*—Greenblum & Bernstein, P.L.C.

(57) ABSTRACT

A MLD-SIMOX wafer is obtained by forming a first ion-implanted layer in a silicon wafer; forming a second ion-implanted layer that is in an amorphous state; and subjecting the wafer to a high-temperature heat treatment to maintain the wafer in an atmosphere containing oxygen at a temperature that is not lower than 1300° C. but lower than a silicon melting point to change the first and the second ion-implanted layers into a BOX layer, wherein the dose amount for the first ion-implanted layer is 1.25 to $1.5 \times 10^{17}$ atoms/cm², the dose amount for the second ion-implanted layer is $1.0 \times 10^{14}$ to $1 \times 10^{16}$ atoms/cm², the wafer is preheated to a temperature of 50° C. to 200° C. before forming the second ion-implanted layer, and the second ion-implanted layer is formed in a state where it is continuously heated to a preheating temperature.

21 Claims, 6 Drawing Sheets

(a)

(b)

METHOD FOR MANUFACTURING SIMOX WAFER

BACKGROUND OF THE INVENTION

1. Field of the Invention

The present invention relates to a method for manufacturing a SIMOX (Separation by IMplanted OXygen) wafer based on a SIMOX technology among methods for manufacturing an SOI (Silicon On Insulater) wafer having a single-crystal silicon layer formed on a silicon single-crystal main body via an oxide film.

2. Description of the Related Art

As conventional methods for manufacturing an SOI wafer, there are known a bonding method for bonding two silicon wafers via an oxide film and a SIMOX method for implanting an oxygen ($O^+$) ion from a silicon wafer surface to form an ion-implanted layer serving as an oxygen layer having a high concentration in a region at a predetermined depth in a wafer and applying a heat treatment to this wafer to change the ion-implanted layer into a buried oxide film (which will be referred to as a BOX layer hereinafter) In particular, an SOI wafer manufactured by the SIMOX method is called a SIMOX wafer.

A method for manufacturing a SIMOX wafer at an initial stage of development is based on a high-dose technology. In this method for manufacturing a low-dose SIMOX wafer, oxygen atoms are implanted into a silicon wafer with an implantation energy of approximately 200 keV at the rate of approximately $2 \times 10^{18}$ atoms/cm$^2$, a BOX layer is formed in the wafer in an ion-implanted state (as-implanted state), and then high-temperature annealing treatment is carried out. A crystal defect that has occurred in the SOI layer by this annealing treatment can be remedied, and the BOX layer can be reformed.

However, since in this high-dose technology for manufacturing the SIMOX wafer an oxygen ion dose amount is large, there has been a problem that many threading dislocations occur in the SOI layer, an ion implantation time is long and a manufacturing efficiency is poor, for example. This threading dislocation brings a leak current or deterioration in a hetero-interface when a device is manufactured. As a result, an improvement in device performance or development of functionality may be obstructed.

Therefore, a low-dose technology has been developed in order to inhibit threading dislocations from being generated in an SOI layer and reduce an ion implantation time. In this method for manufacturing a low-dose SIMOX wafer, oxygen atoms are implanted from a surface of a silicon wafer at the rate of approximately $3.5 \times 10^{17}$ to $4.5 \times 10^{17}$ atoms/cm$^2$ with an implantation energy of approximately 180 keV, and then a high-temperature heat treatment is carried out to form a BOX layer to be continuous in a surface direction parallel to the surface of the silicon surface. In a case where the implantation energy is 180 keV, the BOX layer that is continuous in the surface direction parallel to the wafer surface can be formed only when a dose amount is $3.5 \times 10^{17}$ to $4.5 \times 10^{17}$ atoms/cm$^2$. A fluctuation range of this dose amount is called a dose window. In this high-dose technology for manufacturing the SIMOX wafer, a density of threading dislocations in the SOI layer can be reduced and an implantation time can be reduced to improve a manufacturing efficiency.

However, since the SIMOX wafer obtained based on this low-dose technology has a small oxygen ion dose amount, a film thickness of the BOX layer becomes thin, and reliability of the BOX layer is dubious. Further, in a case where a film thickness of the BOX layer to be formed is thin, when a particle adheres to a silicon wafer surface at the time of ion implantation, this particle functions as a mask so that an unimplantable part is apt to be generated in the ion-implanted layer formed in the silicon wafer. Although the ion-implanted layer becomes the BOX layer by annealing treatment, the unimplantable part serves as a pin hole that is one type of crystal defects to reduce electrical insulation properties. There has been a problem that a percentage of this pin hole density is higher than that of a high-dose SIMOX wafer, for example.

Thus, in order to inhibit generation of the pin hole in the BOX layer, there have been proposed a method for manufacturing an SOI substrate called an ITOX (Internal Thermal OXidation) technology where annealing treatment is performed to an ion-implanted silicon wafer and then oxidizing treatment is carried out in a high-temperature oxygen atmosphere, and an SOI substrate manufactured thereby (see, e.g., Japanese Unexamined Patent Application Publication No. 263538-1995(claim 1, claim 6, paragraphs [0009], [0010], [0025], and [0026], FIG. 1)).

In the method disclosed in Japanese Unexamined Patent Application Publication No. 263538-1995, oxygen atoms are first implanted from a surface of a silicon wafer at the rate of approximately $0.4 \times 10^{18}$ atoms/cm$^2$ with an implantation energy of approximately 180 keV. Then, the wafer having an ion-implanted layer formed therein is subjected to annealing treatment in an inert gas atmosphere containing oxygen whose concentration is less than 1.0% to change the ion-implanted layer into a BOX layer, and then this wafer is further subjected to a high-temperature heat treatment in an atmosphere containing high-concentration oxygen whose concentration exceeds 1%. When the wafer is subjected to the high-temperature heat treatment, high-concentration oxygen in the atmosphere enters the wafer from front and rear surfaces of the wafer to be diffused. When this oxygen stays to be laminated as $SiO_2$ at a BOX layer interface portion, the BOX layer grows, thereby increasing a film thickness of the BOX layer. In a SIMOX wafer obtained by this ITOX technology, when $SiO_2$ is laminated at the BOX layer interface portion, a pin hole generated in the BOX layer can be remedied, thus reducing a pin hole density. Furthermore, roughness of an interface between the BOX layer and the silicon wafer can be improved. As a result, electrical characteristics of a device can be homogenized.

However, even in this manufacturing method based on the ITOX technology, since an oxygen ion dose amount is as large as approximately $0.4 \times 10^{18}$ atoms/cm$^2$, an ion implantation time is long. Moreover, a high-temperature oxidizing treatment is required in addition to the annealing treatment, and hence there is a problem that the manufacturing efficiency is poor and the productivity is lowered.

Thus, in order to reduce the ion implantation time, there has been proposed a method for manufacturing an SOI wafer called an MLD (Modified Low Dose) technology where oxidizing treatment is applied to a wafer having two ion-implanted layers including an amorphous layer formed therein (see, e.g., Specification in U.S. Pat. No. 5,930,643 (claim 1, specification p. 1, the second right column, 11. 5 to 43, FIG. 1(a)).

In the method disclosed in U.S. Pat. No. 5,930,643, ion implantation is divided into two processes, and oxygen atoms are implanted into a wafer having different temperatures each time. As a result, two implanted layers in different states, i.e., a high-concentration oxygen layer and an amorphous layer are formed in the wafer, and then this wafer is subjected to a high-temperature oxidizing treatment in a mixed gas atmosphere.

Specifically, in a state where the silicon wafer is heated, oxygen ions are first implanted at the rate of $2\times10^{17}$ atoms/cm$^2$ with an implantation energy of 185 keV to form a first ion-implanted layer serving as the high-concentration oxygen layer in the wafer. Then, in a state where this wafer is cooled, the oxygen ions are implanted at the rate of $3\times10^{14}$ atoms/cm$^2$ with an implantation energy of 185 keV to form a second ion-implanted layer in an amorphous state in such a manner that this layer becomes continuous with a surface of the first ion-implanted layer on a wafer front surface side. Additionally, when a lower portion of the second ion-implanted layer overlaps an upper portion of the first ion-implanted layer, high-concentration oxygen is contained in the amorphous layer. Further, a temperature of this wafer is increased in an inert atmosphere, e.g., argon containing 0.1 to 10% oxygen, and then this wafer is maintained at a high temperature in an atmosphere containing oxygen of 5 to 100% oxygen containing argon or the like. Maintaining the wafer at a high temperature in this atmosphere containing oxygen changes the first ion-implanted layer into a BOX layer. It is to be noted that the second ion-implanted layer contains high-concentration oxygen in the amorphous layer thereof, and hence re-crystallization does not smoothly advance at the time of increasing a temperature, and the second ion-implanted layer becomes a high-density defective layer including polycrystal, a twin crystal, or a stacking fault. A region in which this defective layer is formed has a property that oxygen readily precipitates. In a subsequent process of maintaining the wafer at a high temperature in the atmosphere containing oxygen, oxygen in the atmosphere containing oxygen enters the wafer from front and rear surfaces of the wafer to be diffused in the wafer, and oxygen is concentrated in this high-density defective layer to separate out as SiO$_2$. The high-density defective layer having SiO$_2$ precipitated therein becomes the BOX layer in this manner. Therefore, an ion dose amount that is as small as $2\times10^{17}$ atoms/cm$^2$ allows acquisition of a SIMOX wafer having a BOX layer whose thickness is the same as that obtained when implanting a double dose amount.

On the other hand, a SIMOX wafer having a BOX layer with a thin film thickness may be required depending on a semiconductor device manufacturer. However, according to the manufacturing method disclosed in U.S. Pat. No. 5,930,643, since oxygen in a high-temperature heat treatment atmosphere is apt to be precipitated in a high-density defective layer, production of a SIMOX wafer having a BOX layer with a thin film thickness is difficult.

SUMMARY OF THE INVENTION

It is an object of the present invention to provide a method for manufacturing an MLD-SIMOX wafer having a BOX layer with a thin film thickness.

As shown in FIG. 1, the invention according to claim 1 is an improvement in a method for manufacturing a SIMOX wafer, the method sequentially comprising: a step of implanting oxygen ions from a surface of a silicon wafer 11 in a state where the wafer 11 is heated to a temperature in the range of 200 to 600° C. to form a first ion-implanted layer 12 having a peak of an oxygen concentration at a position of a depth $d_1$ from the surface of the wafer 11; a step of implanting the oxygen ions from the surface of the wafer 11 having the first ion-implanted layer 12 formed therein to form an amorphous second ion-implanted layer 13 in such a manner that the second ion-implanted layer 13 has a peak of a damage at a position having a depth $d_2$ shallower than the peak depth $d_1$ from the surface of the wafer 11 and is continuous with a surface of the first ion-implanted layer 12 on a front surface of the wafer 11; and a high-temperature heat treatment step of maintaining the wafer 11 in an atmosphere containing oxygen at a temperature that is not lower than 1300° C. but less than a silicon melting point to change the first and the second ion-implanted layers 12 and 13 into a BOX layer 14.

Its characteristic structure lies in that an oxygen ion dose amount for formation of the first ion-implanted layer 12 is 1.25 to $1.5\times10^{17}$ atoms/cm$^2$, an oxygen ion dose amount for formation of the second ion-implanted layer 13 is $1.0\times10^{14}$ to $1.0\times10^{16}$ atoms/cm$^2$, a step of preheating the wafer 11 to a temperature that is not lower than 50° C. but less than 200° C. is further included before the step of forming the second ion-implanted layer 13, and the second ion-implanted layer 13 is formed in a state where the wafer is continuously heated to a preheating temperature.

In the method for manufacturing a SIMOX wafer defined in claim 1, the oxygen ion dose amount for formation of the first ion-implanted layer 12 is a small dose amount that is 1.25 to $1.5\times10^{17}$ atoms/cm$^2$, the oxygen ion dose amount for formation of the second ion-implanted layer 13 is a small dose amount that is $1.0\times10^{14}$ to $1.0\times10^{16}$ atoms/cm$^2$, and the preheating step of maintaining the wafer 11 at a temperature that is not lower than 50° C. but lower than 200° C. is included before the step of forming the second ion-implanted layer 13, so that a SIMOX wafer having a BOX layer with a thin film thickness can be manufactured.

As described above, according to the present invention, an MLD-SIMOX wafer having a BOX layer with a thin film thickness can be manufactured.

DETAILED DESCRIPTION OF THE PREFERRED EMBODIMENTS

Figure 1:
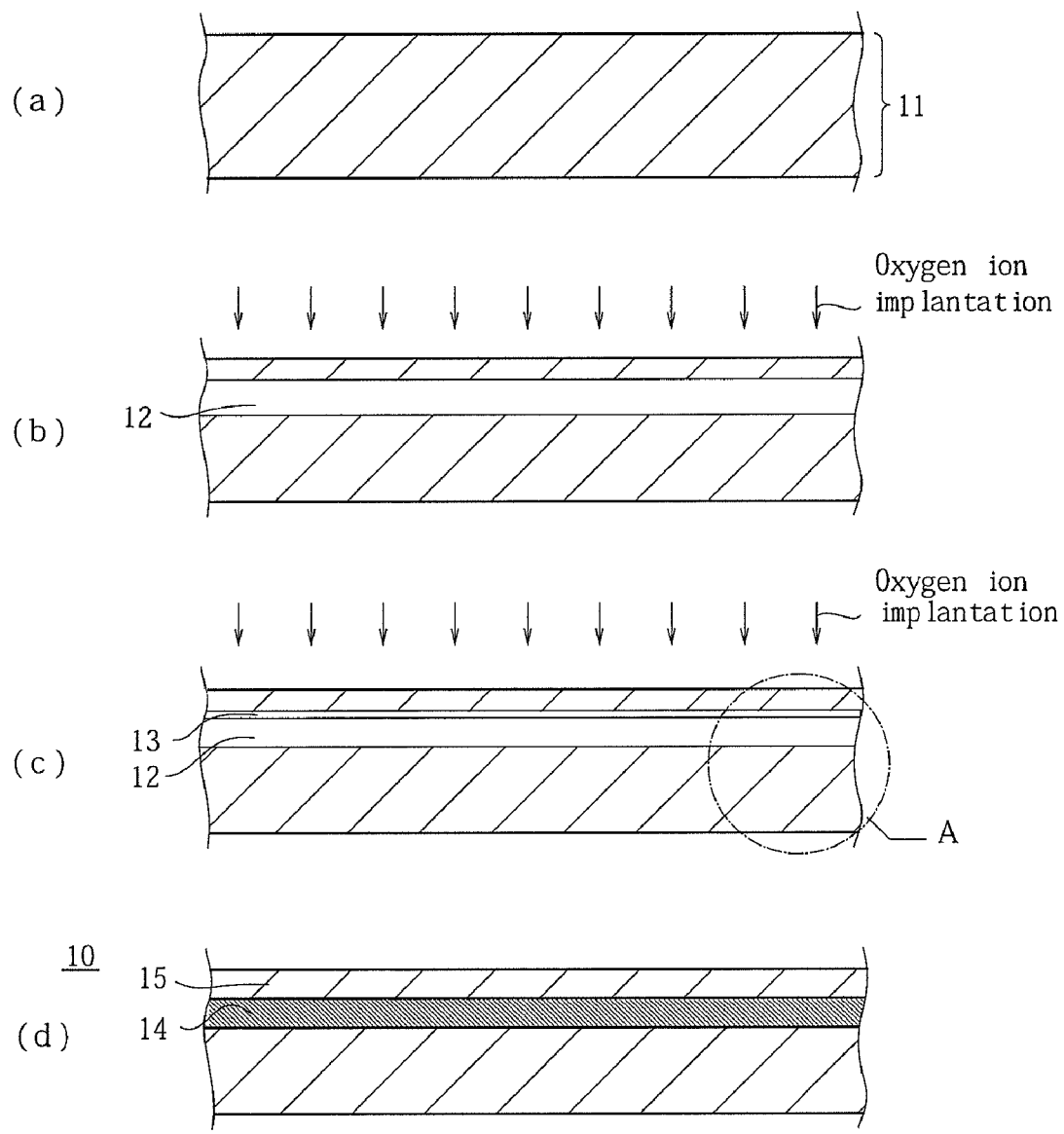
FIG. 1 is a view showing a method for manufacturing a SIMOX wafer according to the present invention.

Examples of the present invention will now be described hereinafter with reference to the accompanying drawings.

As shown in FIGS. 1(a) to 1(d), a method for manufacturing a SIMOX wafer according to the present invention includes: a step of implanting oxygen ions from surfaces of a plurality of silicon wafers 11 in a lot once to form a first ion-implanted layer 12 in each wafer 11; a preheating step of maintaining these wafers 11 at a temperature that is not lower than 50° C. but lower than 200° C. for a predetermined time; a step of implanting the oxygen ions from the surfaces of these wafers 11 the second time to form an amorphous second ion-implanted layer 13 in such a manner that the second ion-implanted layer 13 becomes continuous with the first ion-implanted layer 12 on a front surface of each wafer 11; and a high-temperature heat treatment step of applying a heat treatment to these wafers 11 in an atmosphere containing oxygen to change the first and the second ion-implanted layers 12 and 13 into a BOX layer 14. In the manufacturing method according to the present invention, manufacturing the plurality of wafers as one lot is preferable.

The method for manufacturing a SIMOX wafer according to the present invention will now be explained in accordance with each step.

<First Ion-implanted Layer Forming Step>

In the first ion-implanted layer forming step, as shown in FIGS. 1(a) and 1(b), oxygen ions are first implanted from the surface of a silicon wafer 11 to form the first ion-implanted layer 12 in the wafer 11. It is preferable for the silicon wafer 11 shown in FIG. 1(a) to be manufactured based on a Czochralski method.

The first ion-implanted layer 12 is formed as follows. First, the silicon wafer 11 is accommodated in an ion implanter (not shown), and the oxygen ions are implanted from the surface of the wafer 11 by beam irradiation in a state where the inside of the implanter is heated to a temperature in the range of 200 to 600° C. or, preferably, 300 to 500° C. in such a manner that an oxygen concentration peak is provided at a predetermined depth $d_1$ from the surface of the wafer 11 as shown in a region (a) in FIG. 3. An atmosphere in the implanter is a vacuum state. When the inside of the device is heated to a temperature in the range of 200 to 600° C., the ion can be implanted while the surface of the wafer 11 is maintained in a single-crystal silicon state, and the first ion-implanted layer 12 as a high-concentration oxygen layer can be formed while damage due to ion implantation is remedied. When the temperature is lower than 200° C., since the damage due to ion implantation cannot be remedied, the damage remains in the first ion-implanted layer. When the temperature exceeds 600° C., since a degasification amount is large, there occurs inconvenience that a degree of vacuum in the implanter is lowered.

Here, a dose amount of the oxygen ion is 1.25 to $1.5 \times 10^{17}$ atoms/cm². The oxygen ion dose amount is restricted to 1.25 to $1.5 \times 10^{17}$ atoms/cm² for the following reason. When this dose amount is less than $1.25 \times 10^{17}$ atoms/cm², there occurs inconvenience that the continuous BOX layer cannot be formed since the dose amount is small. When the dose amount exceeds $1.5 \times 10^{17}$ atoms/cm², there occurs inconvenience that a thickness of the BOX layer becomes thick and quality such as SOI layer surface roughness, interface roughness of the BOX layer and the SOI layer, and breakdown voltage of the BOX layer is deteriorated since the dose amount is large.

The oxygen ions are implanted based on beam irradiation in such a manner that the oxygen concentration peak is provided at the peak depth $d_1$ that is 0.2 to 0.5 μm or, preferably, 0.3 to 0.45 μm from the surface of the wafer 11. In order to achieve this, an implantation energy is set to 100 to 200 keV or, preferably, 120 to 180 keV. The implantation energy is restricted to 100 to 200 keV because ion implantation becomes shallow, the BOX layer is formed to reach the wafer surface during the high-temperature heat treatment, and the SOI layer is lost when the implantation energy is less than 100 keV. When the implantation energy exceeds 200 keV, oxygen ion implantation from the wafer surface becomes too deep, oxygen that has entered the wafer to be diffused is hard to reach the first ion-implanted layer during the high-temperature heat treatment, and hence a high-quality BOX layer cannot be formed.

It is to be noted that each wafer 11 having the first ion-implanted layer 12 formed therein is cooled after completion of the first ion-implanted layer forming step. Subsequently, the plurality of wafers are sequentially taken out one by one from the inside of the cooled implanter, cleaned, dried, again sequentially accommodated one by one in the implanter, and subjected to the following preheating step.

<Preheating Step>

Figure 3:
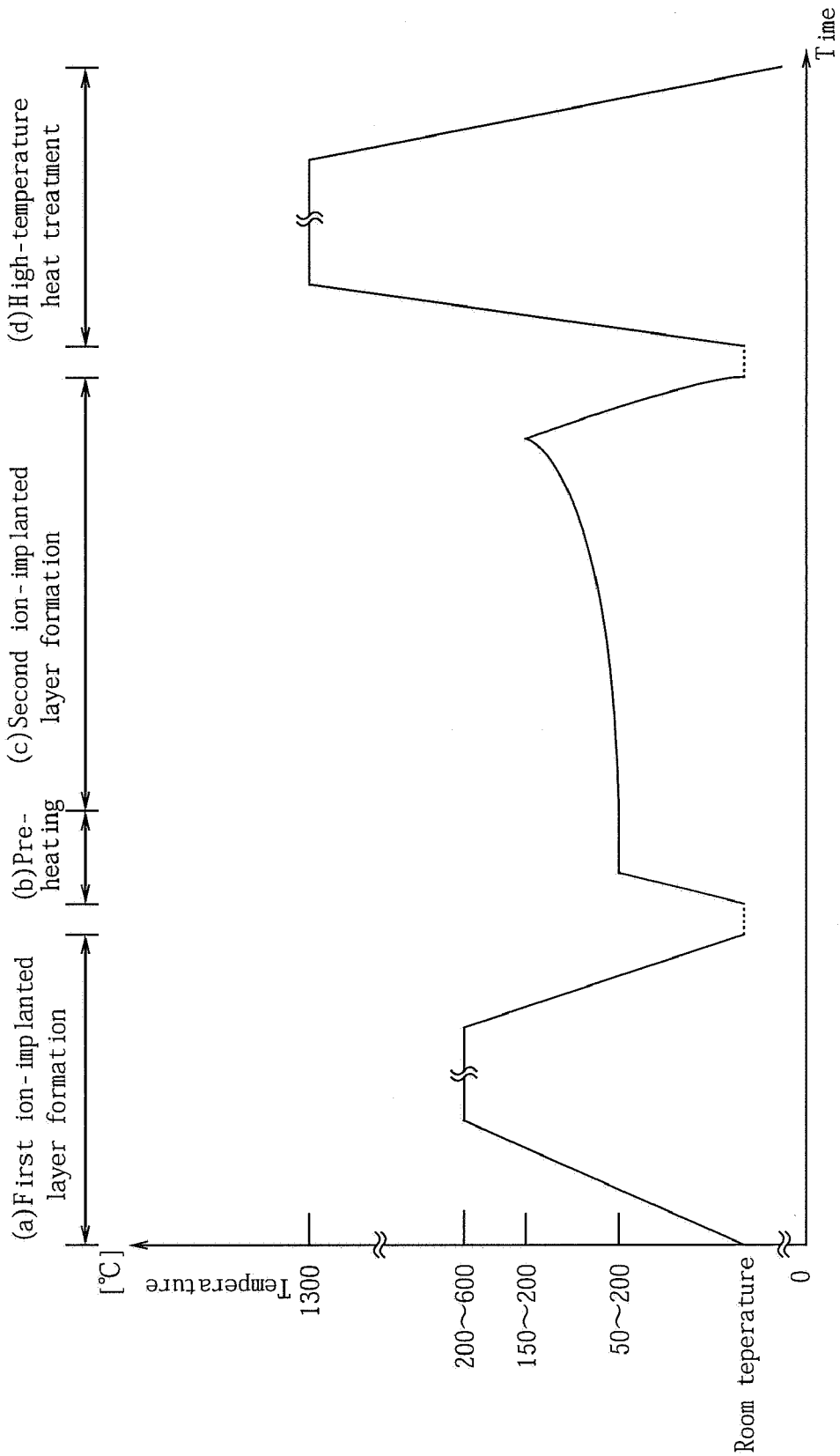
FIG. 3 is a view showing a profile of a temperature and a time corresponding to FIGS. 1(a) to 1(d) according to an embodiment of the present invention.

As shown in a region (b) in FIG. 3, in the preheating step, the wafer 11 having the first ion-implanted layer 12 formed therein is accommodated in the ion implantation device, and heated to a temperature that is not lower than 50° C. but lower than 200° C. or, preferably, 100 to 150° C. by a lamp heater. An atmosphere in the device is a vacuum state.

The preheating temperature is restricted to a temperature that is not lower than 50° C. but less than 200° C. for the following reason. When the temperature is less than 50° C., an amorphous layer becomes thick, and hence a BOX layer also becomes thick. When the temperature is not lower than 200° C., since the amorphous layer cannot be formed, the continuous BOX layer cannot be inconveniently formed.

<Second Ion-implanted Layer Forming Step>

In the second ion-implanted layer forming step, as shown in FIG. 1(c), oxygen ions are implanted from the surface of the wafer 11 the second time to form the second ion-implanted layer 13 that is in an amorphous state in such a manner that the second ion-implanted layer 13 becomes continuous with the first ion-implanted layer 12 on the front surface of the wafer 11.

The second ion-implanted layer 12 is formed by implanting the oxygen ions into the preheated wafer 11 from the surface of the wafer 11 based on beam irradiation while a state that the wafer 11 is preheated to a preheating temperature in such a manner that a peak of a damage is provided at a predetermined depth $d_2$ from the surface of the wafer 11 is maintained. An atmosphere in the implanter is a vacuum state.

A dose amount of the oxygen ion in this example is $1.0 \times 10^{14}$ to $1.0 \times 10^{16}$ atoms/cm² or, preferably, $1.0 \times 10^{15}$ to $1.0 \times 10^{16}$ atoms/cm². The dose amount of the oxygen ion is restricted to $1.0 \times 10^{14}$ to $1.0 \times 10^{16}$ atoms/cm² for the following reason. When the dose amount is less than $1.0 \times 10^{14}$ atoms/cm², the amorphous layer cannot be formed, and hence inconvenience that the continuous BOX layer cannot be formed occurs. When the dose amount exceeds $1.0 \times 10^{16}$ atoms/cm², the amorphous layer becomes thick, and hence an inconvenience that the BOX layer becomes thick occurs.

Figure 2:
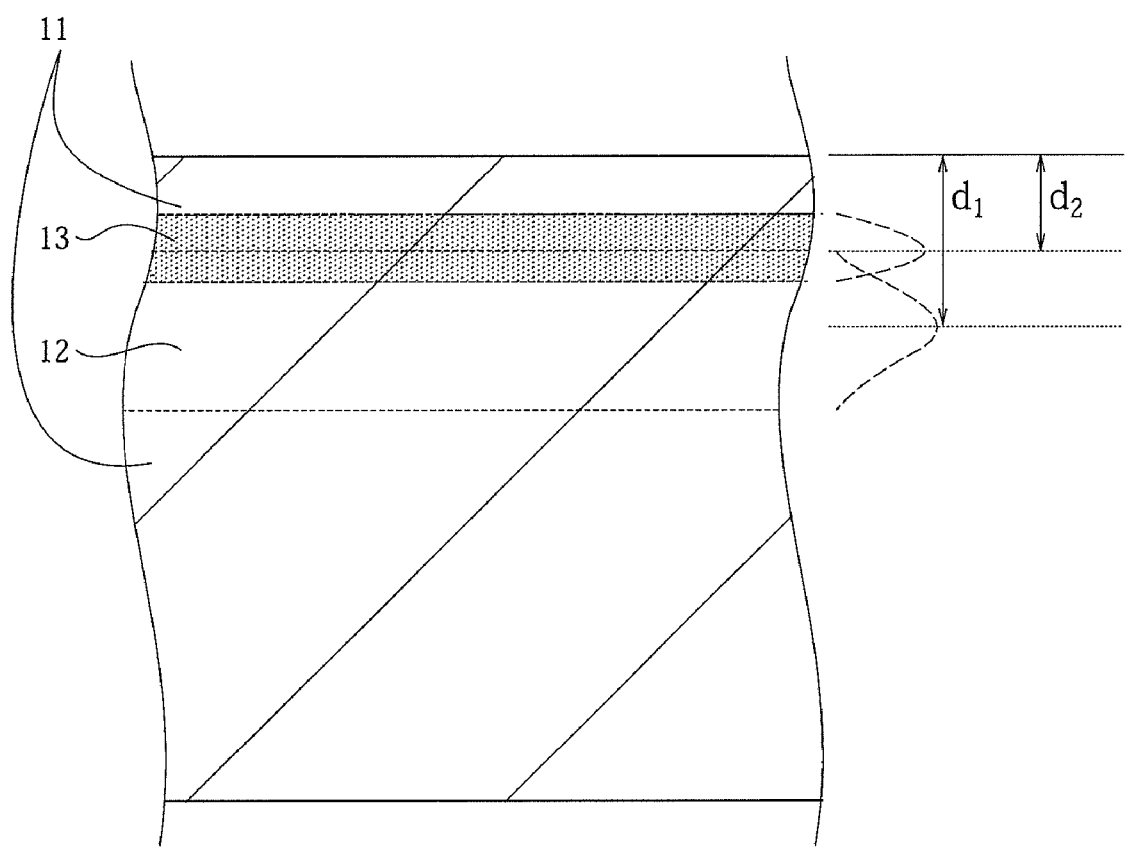
FIG. 2 is an enlarged view of a part A in FIG. 1(c) showing peaks and distributions of a first ion-implanted layer and a second ion-implanted layer in the SIMOX wafer according to the present invention.

As shown in FIG. 2, the oxygen ions are implanted by beam irradiation in such a manner that a peak of damage is provided at the peak depth $d_2$ that is 0.2 to 0.4 μm or, preferably, 0.3 to 0.35 μm from the surface of the wafer 11. The peak depth $d_1$ of the oxygen concentration and the peak depth $d_2$ of the damage are adjusted in such a manner that the second ion-implanted layer 13 in the amorphous state is formed to be continuous with the surface of the first ion-implanted layer 12 on the wafer front surface.

In order to achieve this, an implantation energy is set to 100 to 200 keV or, preferably, 120 to 180 keV. Further, a value obtained by subtracting the implantation energy at the step of forming the second ion-implanted layer 13 from the implantation energy at the step of forming the first ion-implanted layer 12 is set to 0 to 50 keV or, preferably, 0 to 20 keV. Here, the implantation energy is restricted to 100 to 200 keV for the following reason. When the implantation energy is less than 100 keV, ion implantation becomes shallow, the BOX layer is formed to reach the wafer surface during the high-temperature heat treatment, and the SOI layer is lost. When the implantation energy exceeds 200 keV, oxygen ion implantation from the wafer surface becomes too deep, oxygen that has entered the wafer to be diffused is hard to reach the second ion-implanted layer during the high-temperature heat treatment, and a high-quality BOX layer cannot be formed. Moreover, the subtraction value is restricted to 0 to 50 keV because there occurs inconvenience that a BOX layer continuous in a surface direction parallel to the wafer surface is hard to be formed occurs when the subtraction value exceeds 50 keV. Restricting the subtraction value to 0 to 50 keV allows the setting of the oxygen concentration peak depth $d_1$ to 0.2 to 0.5 µm from the surface of the wafer 11 and the setting of the damage peak depth $d_2$ to 0.2 to 0.4 µm from the surface of the wafer 11.

Additionally, as shown in a region (c) in FIG. 3, when beam irradiation heat is added to a temperature in the implanter that is maintained at a preheating temperature in the range of 50 to 200° C., the wafer temperature elevates to 150 to 200° C. When the wafer temperature exceeds 200° C., damage due to the second ion implantation is remedied, and hence there occurs inconvenience that an amorphous layer cannot be obtained. Therefore, an upper limit of the preheating temperature is 200° C.

It is to be noted that the plurality of wafers having the first and the second ion-implanted layers 12 and 13 formed therein are sequentially taken out one by one, cleaned, dried, then sequentially accommodated in an anneal furnace one by one, and subjected to the following high-temperature heat treatment after completion of the second ion-implanted layer forming step.

<High-temperature Heat Treatment Step>

In the high-temperature heat treatment step, as shown in FIG. 1(d), a high-temperature heat treatment is applied to the wafer 11 in an atmosphere containing oxygen to change the first and the second ion-implanted layers 12 and 13 into the BOX layer 14.

Formation of the BOX layer 14 based on the high-temperature heat treatment is carried out in the following manner. The wafer 11 having the first and the second ion-implanted layers 12 and 13 formed therein is taken out from the ion implantation device accommodating the wafer 11, the taken-out wafer 11 is subjected to, e.g., cleaning, and then it is accommodated in the heat treatment furnace. As shown in a region (d) in FIG. 3, the temperature in this furnace is increased to a temperature that is not lower than 1300° C. but less than a silicon melting point or, preferably, 1320 to 1350° C., the wafer 11 is held while this temperature is maintained for 6 to 36 hours or, preferably, 12 to 24 hours, and then the wafer 11 is cooled to a room temperature.

An atmosphere in the furnace during the temperature elevation is a mixed atmosphere of an inert gas, e.g., argon or nitrogen ($N_2$) containing 0 to 5.0 volume % or, preferably, 0.5 to 1.0 volume % of oxygen. An atmosphere in the furnace after the temperature elevation is an atmosphere containing oxygen of 5.0 to 100.0 volume % or, preferably, 10 to 50 volume % of oxygen containing an inert gas such as argon or nitrogen.

Although not shown, the BOX layer 14 to be formed is constituted of a lower first BOX layer and an upper second BOX layer. When the temperature starts to elevate, oxygen precipitates appear from a lower side of the first ion-implanted layer 12 serving as a high-concentration oxygen layer, and this layer starts to change into the first BOX layer. Further, the amorphous second ion-implanted layer 13 starts to change into a high-density crystal defect layer (not shown). During the maintenance of the high temperature in the atmosphere containing oxygen, oxygen in the atmosphere containing oxygen is concentrated in the high-density crystal defect layer to be precipitated, whereby the high-density crystal defect layer is changed into the second BOX layer continuous with the first BOX layer.

Here, the temperature in the furnace is restricted to the range that is not lower than 1300° C. but lower than a silicon melting point for the following reason. When the temperature is less than 1300° C., the melting and coupling of oxygen precipitates are insufficient, and there occurs inconvenience that the high-quality BOX layer cannot be formed.

The holding time is restricted to 6 to 36 hours for the following reason. When the holding time is less than 6 hours, the melting and coupling of the oxygen precipitates are insufficient, and there occurs inconvenience that the high-quality BOX layer cannot be formed. When the holding time exceeds 36 hours, a manufacturing efficiency is deteriorated, and there occurs inconvenience that productivity is lowered.

In this manner, an MLD-SIMOX wafer 10 having the BOX layer with a thin film thickness can be obtained based on the manufacturing method according to the present invention. Furthermore, surface roughness of the SOI layer 15 and interface roughness of the BOX layer 14 and the SOI layer 15 can be reduced, and breakdown voltage of the BOX layer 14 can be improved.

EXAMPLES

Examples according to the present invention will now be explained in detail together with comparative examples.

Example 1

As shown in FIG. 1, a silicon wafer 11 formed of a P-type silicon wafer having a diameter of 300 mm, a crystal orientation of <100>, and resistivity of 10 to 20 Ωcm was prepared. First, after sequentially accommodating each wafer 11 in the ion implanter, the inside of the implanter was changed to a vacuum state, and the temperature in the device was increased to 400° C. Then, oxygen ions ($O^+$) were implanted from a surface of the wafer 11 with a dose amount of $1.25 \times 10^{17}$ atoms/$cm^2$ based on an implantation energy of 180 keV to form a first ion-implanted layer 12 in each wafer 11, the first ion-implanted layer 12 having a peak at a position of a depth 0.45 µm from the surface of the wafer 11. Then, the temperature in the implanter was lowered.

Subsequently, each wafer 11 was sequentially taken out from the implanter and cleaned. Each cleaned wafer 11 was dried, and then again sequentially accommodated in the device. Thereafter, the inside of the implanter was preheated from a room temperature to 50° C. In a state where this temperature is maintained, the oxygen ions ($O^+$) were implanted from the surface of the wafer 11 with a dose amount of $1.0 \times 10^{16}$ atoms/$cm^2$ based on an implantation energy of 160 keV, whereby a second ion-implanted layer 13 was formed to partially overlap the first ion-implanted layer 12 on the front surface side of the wafer 11, the second ion-implanted layer 13 having a peak at a position of a depth 0.3 µm from the surface of the wafer 11. Then, the temperature in the implanter was lowered.

Subsequently, each wafer 11 was sequentially taken out from the implanter and cleaned. Each cleaned wafer 11 was dried, and then sequentially accommodated in a vertical furnace. Then, the inside of the furnace was heated to 1350° C. Moreover, an atmosphere in the furnace was controlled to become an oxidizing atmosphere containing 50 volume % of oxygen and 50 volume % of argon based on a mass flow.

Each wafer 11 was held for 12 hours while the temperature in the furnace was maintained at 1350° C. in this oxidizing atmosphere. As a result, a SIMOX wafer 10 having a BOX layer 14 was obtained. This SIMOX wafer 10 is referred to Example 1.

Example 2

A SIMOX wafer 10 was obtained like Example 1 except that an ion dose amount was set to $1.5 \times 10^{17}$ atoms/cm² at the first ion-implanted layer forming step. This SIMOX wafer 10 is referred to Example 2.

Comparative Example 1

A SIMOX wafer 10 was obtained like Example 1 except that an ion dose amount was set to $1.0 \times 10^{17}$ atoms/cm² at the first ion-implanted layer forming step. This SIMOX wafer 10 is referred to Comparative Example 1.

Comparative Example 2

A SIMOX wafer 10 was obtained like Example 1 except that an ion dose amount was set to $1.75 \times 10^{17}$ atoms/cm² at the first ion-implanted layer forming step. This SIMOX wafer 10 is referred to Comparative Example 2.

Comparative Example 3

A SIMOX wafer 10 was obtained like Example 1 except that an ion dose amount was set to $2.0 \times 10^{17}$ atoms/cm² at the first ion-implanted layer forming step. This SIMOX wafer 10 is referred to Comparative Example 3.

Comparative Example 4

A SIMOX wafer 10 was obtained like Example 1 except that an ion dose amount was set to $2.25 \times 10^{17}$ atoms/cm² at the first ion-implanted layer forming step. This SIMOX wafer 10 is referred to Comparative Example 4.

Examples 3 and 4

SIMOX wafers 10 were respectively obtained like Examples 1 and 2 except that a preheating temperature was set to 100° C. These wafers 10 are referred to Examples 3 and 4.

Comparative Examples 5 to 8

SIMOX wafers 10 were respectively obtained like Comparative Examples 1 to 4 except that a preheating temperature was set to 100° C. These SIMOX wafers 10 are referred to Comparative Examples 5 to 8.

Examples 5 and 6

SIMOX wafers 10 were respectively obtained like Examples 1 and 2 except that a preheating temperature was set to 150° C. These wafers 10 are referred to Examples 5 and 6.

Comparative Examples 9 to 12

SIMOX wafers 10 were respectively obtained like Comparative Examples 1 to 4 except that a preheating temperature was set to 150° C. These SIMOX wafers 10 are referred to Comparative Examples 9 to 12.

Comparative Test and Evaluation

Figure 4:
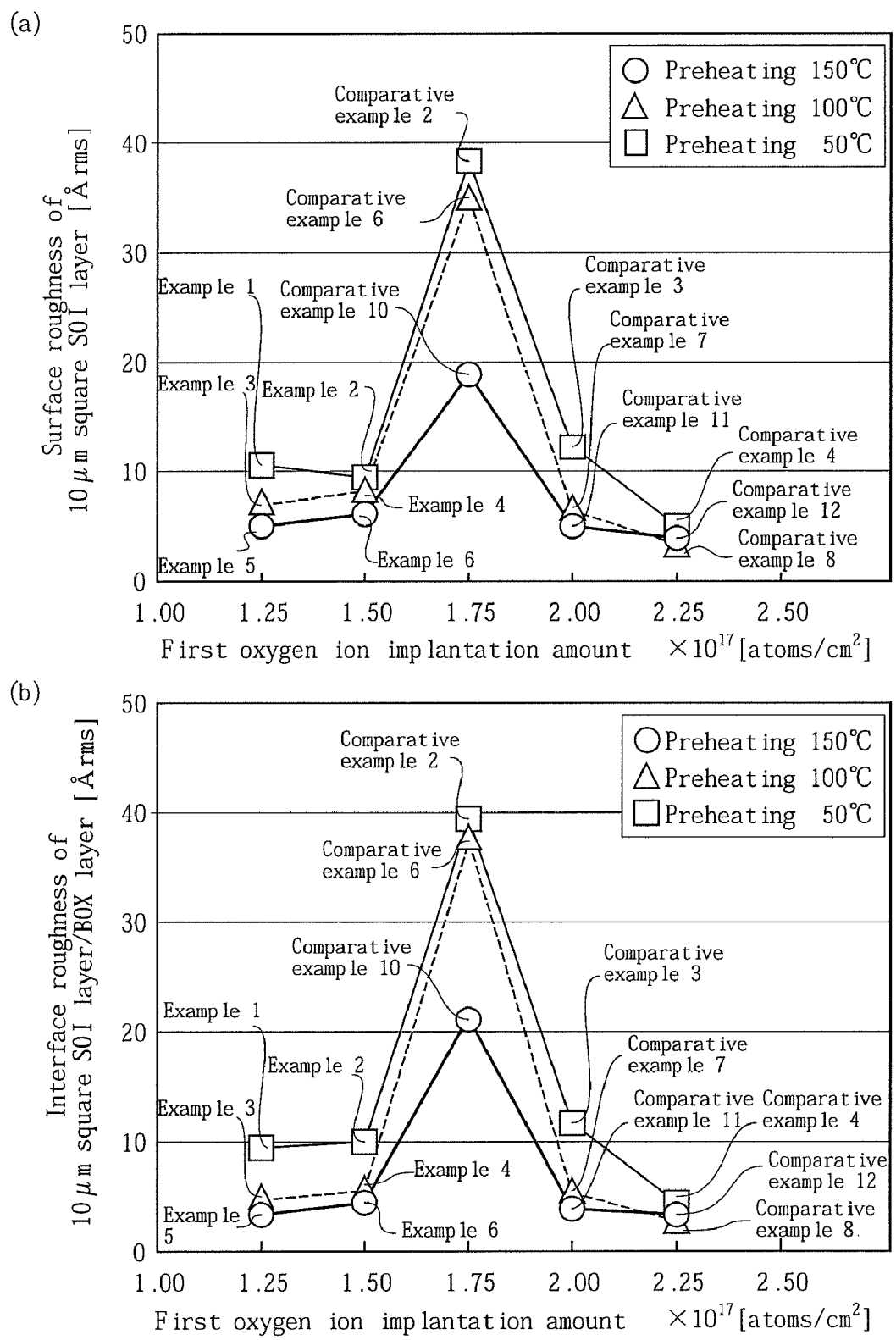
FIG. 4(a) is a view showing a relationship between an ion dose amount and SOI layer surface roughness at a preheating temperature in a second ion-implanted layer forming step.
FIG. 4(b) is a view showing a relationship between an ion dose amount and interface roughness of the SOX layer and a BOX layer at the preheating temperature.
Figure 5:
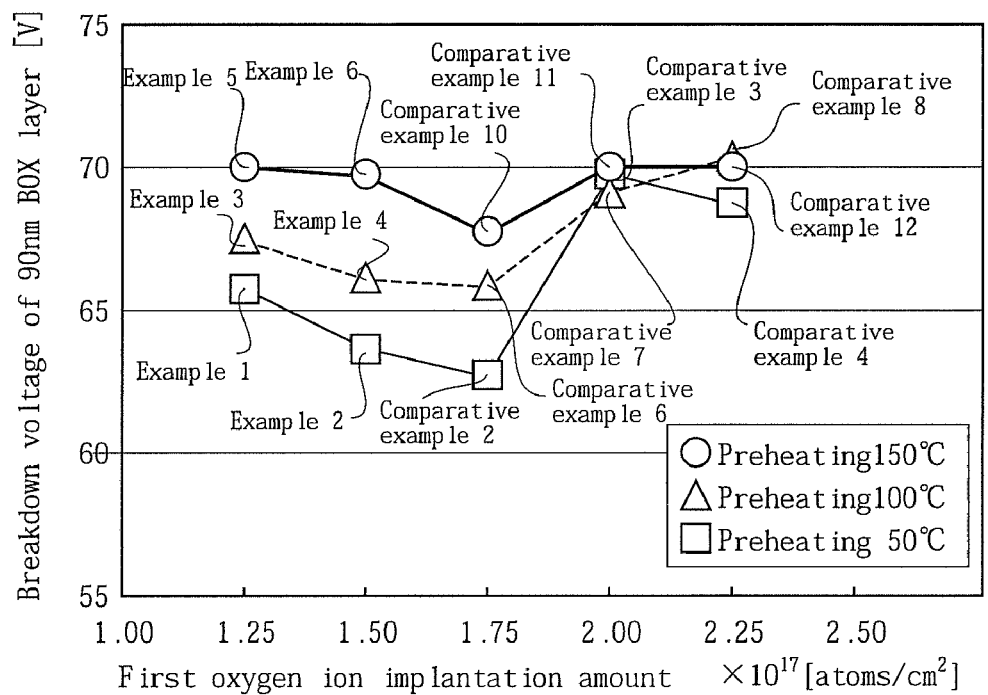
FIG. 5(a) is a view showing a relationship between an ion dose amount and a breakdown voltage of the BOX layer at the preheating temperature in the second ion-implanted layer forming step.
FIG. 5(b) is a view showing a relationship between an ion dose amount and a breakdown electric field of the BOX layer at the preheating temperature.
Figure 5:
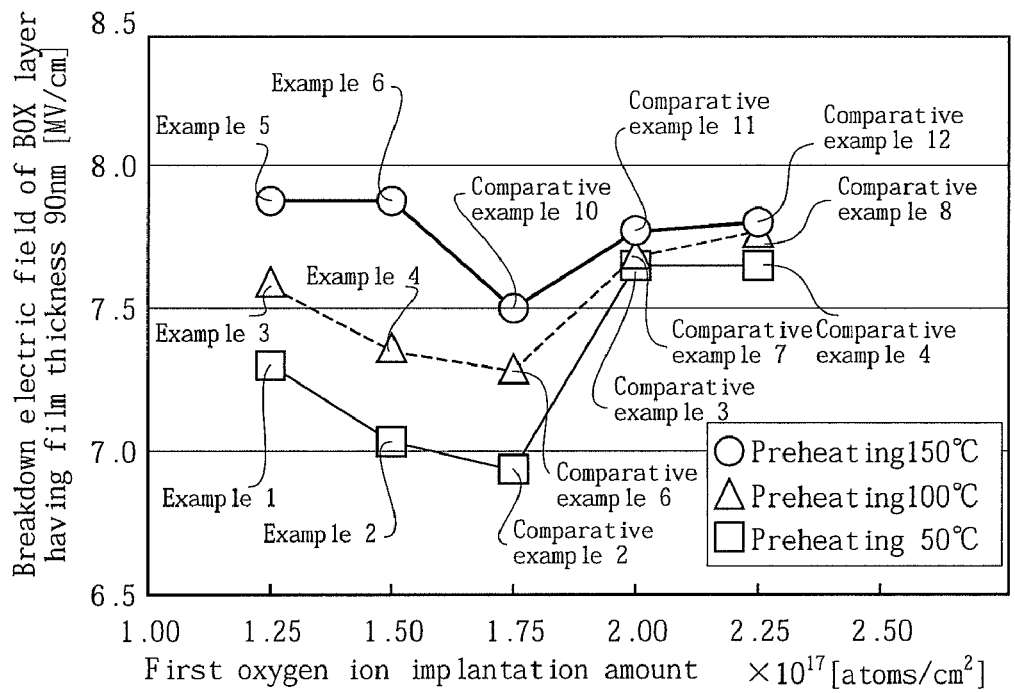
Figure 6:
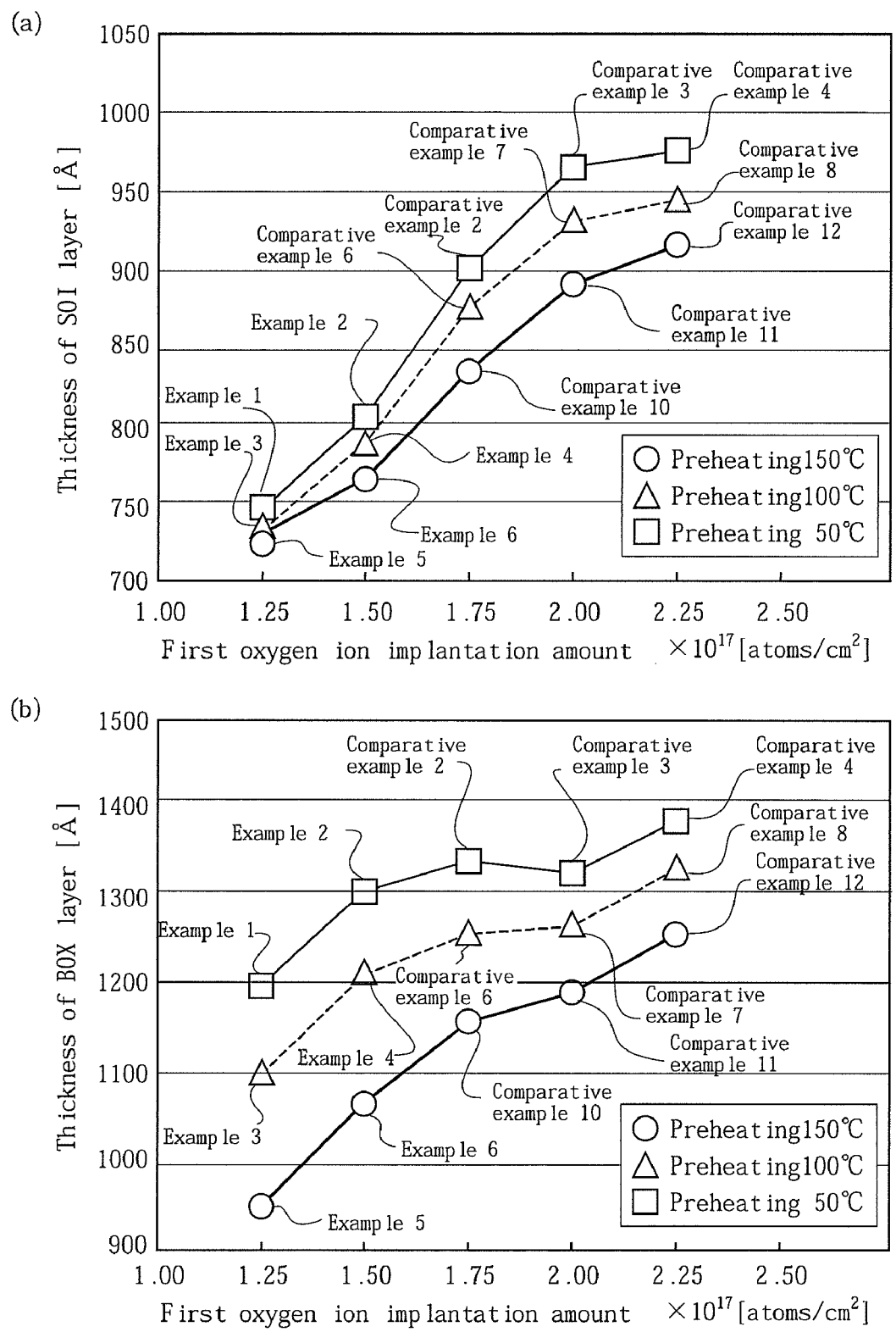
FIG. 6(a) is a view showing a relationship between an ion dose amount and a thickness of the SOI layer at the preheating temperature in the second ion-implanted layer forming step.
FIG. 6(b) is a view showing a relationship between an ion dose amount and a thickness of the BOX layer at the preheating temperature.

Thicknesses of an SOI layer and a BOX layer in the SIMOX wafer in each of Examples 1 to 6 and Comparative Examples 1 to 12 were measured by using a spectral ellipsometer. Further, root mean square roughness (Rms) of a surface of the SOI layer was observed by using an AFM (Atomic Force Microscope). Furthermore, the SOI layer in each SIMOX wafer was removed to observe interface roughness Rms of the SOI layer and the BOX layer by using the AFM. Moreover, breakdown voltage of the BOX layer were evaluated by using a breakdown voltage tester. FIGS. 4 to 6 shows these results. In regard to a wafer in which no BOX layer is formed, the results are not reflected in FIGS. 4 to 6.

As apparent from FIGS. 4(a) and 4(b), when a dose amount is $1.75 \times 10^{17}$ atoms/cm², both the SOI layer surface roughness Rms and the interface roughness Rms of the SOI layer and the BOX layer demonstrate maximum values in respective preheating temperature graphs. Additionally, there was observed a tendency that the roughness is decreased as the preheating temperature is increased. These tendencies are observed based on a growth method of the BOX layer.

Growth of the BOX layer means that small oxygen precipitates congregate with respect to a larger oxygen precipitate and they are absorbed and lost, and this is called Ostwald growth. When a first ion dose amount for formation of the first ion-implanted layer is large, oxygen precipitates constituting the first BOX layer mainly absorb oxygen precipitates forming the second BOX layer, thereby growing the BOX layer. Contrarily, when the first ion dose amount is small, oxygen precipitates constituting the second BOX layer mainly absorb oxygen precipitates forming the first BOX layer, thereby growing the BOX layer. When the main oxygen precipitate and the sub-oxygen precipitate are determined, the Ostwald growth smoothly advances.

However, when the first ion dose amount is approximately $1.75 \times 10^{17}$ atoms/cm², sizes of the oxygen precipitates respectively constituting the first and the second BOX layers become substantially equal to each other, and they antagonize each other. Therefore, the main part and the sub part in the BOX layer cannot be determined, and the Ostwald growth does not smoothly advance. Accordingly, the inside of the BOX layer undulates, and the interface roughness of the BOX layer and the SOI layer is increased. Further, this undulation spreads to the surface of the SOI layer, and hence the surface roughness is also increased.

Furthermore, when the dose amount exceeds $2.0 \times 10^{17}$ atoms/cm², oxygen precipitates constituting the first BOX layer absorb oxygen precipitates forming the second BOX layer, and the Ostwald growth smoothly advances. Therefore, the roughness is reduced. However, since the ion dose amount is increased, the BOX layer having a thin film thickness cannot be obtained.

On the other hand, when the dose amount is less than $1.25 \times 10^{17}$ atoms/cm², since the dose amount is small, the BOX layer that is continuous in a surface direction parallel to the surface of the wafer 11 cannot be obtained.

FIGS. 5(a) and 5(b) show that a breakdown voltage and a breakdown electric field of the BOX layer have minimum values when the first ion dose amount is $1.75 \times 10^{17}$ atoms/cm². Further, the breakdown voltage tends to be improved as the preheating temperature is increased.

As apparent from FIGS. 6(a) and 6(b), both a thickness of the SOI layer and a thickness of the BOX layer tend to be increased as the first ion dose amount is raised. Furthermore, both a thickness of the SOI layer and a thickness of the BOX layer tend to be reduced as the preheating temperature is increased.

It was revealed from the results of Examples 1 to 6 and Comparative Examples 1 to 12 that an MLD-SIMOX wafer having the BOX layer with a thin film thickness that allows a reduction in the SOI layer surface roughness and the interface roughness of the BOX layer and the SOI layer and an improvement in the withstand voltage characteristics of the BOX layer can be obtained. In this wafer, it was found that an excellent SIMOX wafer that has the BOX layer with a particularly thin film thickness and the small roughness can be obtained when the ion dose amount is as small as 1.25 to $1.5 \times 10^{17}$ atoms/cm$^2$ and the preheating temperature is as high as 100 to 150° C.

What is claimed is:

1. A method for manufacturing a SIMOX wafer sequentially comprising:
    heating a wafer to a temperature in the range of 200 to 600° C. and implanting oxygen ions from a surface of a silicon wafer in an ion-implanting device and to form a first ion-implanted layer having a peak oxygen concentration at a depth $d_1$ from the surface of the wafer;
    implanting the oxygen ions from the surface of the wafer having the first ion-implanted layer formed therein in the ion-implanting device to form a second ion-implanted layer that is in an amorphous state such that the second ion-implanted layer has a damage peak at a depth $d_2$ wherein depth $d_2$ is shallower than depth $d_1$ and becomes continuous with a surface of the first ion-implanted layer on a front surface side of the wafer; and
    subjecting the wafer to a high temperature heat treatment in a furnace in an atmosphere containing oxygen wherein the temperature is elevated to not lower than 1300° C. but lower than the melting point of silicon to change the first and the second ion-implanted layers into a BOX layer,
    wherein an oxygen ion dose amount for formation of the first ion-implanted layer is 1.25 to $1.5 \times 10^{17}$ atoms/cm$^2$, an oxygen ion dose amount for formation of the second ion-implanted layer is $1.0 \times 10^{14}$ to $1.0 \times 10^{16}$ atoms/cm$^2$, the wafer is preheated to a temperature to at least 50° C. but lower than 200° C. before forming the second ion-implanted layer, and the second ion-implanted layer is formed while continuously heating the wafer to the preheating temperature and wherein a plurality of wafers having only the first and second ion implantation layers formed therein are sequentially, one by one, removed from the ion implanting device and cleaned, dried and subjected to the high temperature heat treatment in a heat treatment furnace comprising:
    elevating a temperature from 1320 to 1350° C. in an atmosphere containing an inert gas and oxygen of 0 to 5.0 volume %, holding the elevated temperature for 6 to 36 hours in an atmosphere containing a mixture of an inert as and oxygen of 10.0 to 50.0 volume %; and
    cooling the wafer to room temperature.

2. The method of claim 1 wherein depth $d_1$ is from 0.2 to 0.5 µm.

3. The method of claim 2 wherein depth $d_1$ is from 0.3 to 0.45 µm.

4. The method of claim 1 wherein the implantation of the oxygen ions is carried out at an implantation energy of 100 to 200 keV.

5. The method of claim 4 wherein the implantation of the oxygen ions is carried out at an implantation energy of 120 to 180 keV.

6. The method of claim 1 wherein after forming the first implantation layer, the wafer is cooled, and thereafter cleaned and dried prior to being subjected to the implantation of the second implantation layer.

7. The method of claim 1 wherein the wafer is preheated to a temperature from 100° C. to 150° C.

8. The method of claim 1 wherein the oxygen implantation of the preheated wafer is carried out by beam implantation in a manner such that the damage $d_2$ peak is maintained.

9. The method of claim 8 wherein the implantation is carried out in a vacuum.

10. The method of claim 1 wherein the dose amount for the formation of the second ion implanted layer is from $1.0 \times 10^{15}$ to $1.0 \times 10^{16}$ atoms/cm$^2$.

11. The method of claim 1 wherein the oxygen ions for the second ion implanted layer are implanted by beam irradiation.

12. The method of claim 11 wherein the oxygen ions are implanted in a manner such that depth $d_2$ is from 0.2 to 0.4 µm.

13. The method of claim 12 wherein the oxygen ions are implanted in a manner such that depth $d_2$ is from 0.3 to 0.35 µm.

14. The method of claim 1 wherein an ion implantation energy of 100 to 200 keV is used.

15. The method of claim 14 wherein the ion implantation energy is from 120 to 180 keV.

16. The method of claim 14 wherein the difference between the ion implantation energy for forming the second ion implantation layer and the first ion implantation layer is from 0 to 50 keV.

17. The method of claim 16 wherein the difference between the ion implantation energy for forming the second ion implantation layer and the first ion implantation layer is from 0 to 20 keV.

18. The method of claim 1 wherein the wafer is held at this temperature for 12 to 24 hours.

19. The method of claim 1 wherein the inert gas is selected from the group consisting of argon, nitrogen and mixtures thereof.

20. The method of claim 1 wherein, during the temperature elevation the amount of oxygen is from 0.5 to 1.0 volume %.

21. A SIMOX wafer prepared by the method of claim 1.

* * * * *